United States Patent [19]

Chen et al.

[11] Patent Number: 6,123,776
[45] Date of Patent: Sep. 26, 2000

[54] GAS DELIVERING APPARATUS FOR CHEMICAL VAPOR DEPOSITION

[75] Inventors: Kuen-Jian Chen, Hsinchu Hsien; Horng-Bor Lu, Hsinchu, both of Taiwan

[73] Assignee: United Microelectronics Corp., Hsinchu, Taiwan

[21] Appl. No.: 09/064,386

[22] Filed: Apr. 22, 1998

[30] Foreign Application Priority Data

Mar. 4, 1998 [TW] Taiwan .................................. 87203109

[51] Int. Cl.⁷ .................................................. C23C 16/00
[52] U.S. Cl. ........................................... 118/726; 118/715
[58] Field of Search ...................................... 118/726, 715

[56] References Cited

U.S. PATENT DOCUMENTS

| | | | |
|---|---|---|---|
| 5,350,453 | 9/1994 | Schlosser | 118/719 |
| 5,403,399 | 4/1995 | Kurihara et al. | 118/723 |
| 5,772,771 | 6/1998 | Li et al. | 118/723 |
| 5,861,135 | 1/1999 | Tanabe et al. | 423/446 |

*Primary Examiner*—Christopher A. Fiorilla

[57] ABSTRACT

A gas delivering apparatus useful for improving the level of uniformity of thin film deposited over a silicon wafer in a chemical vapor deposition. By reshaping the injector from a conventional straight hollow tube to a funnel-shaped profile, the opening of the injector is widened. With a wider injector opening, the gas flow rate becomes slower and hence more capable of spreading over a wider wafer surface area. Consequently, a uniform gas flow pattern is established resulting in the deposition of a uniform layer.

3 Claims, 3 Drawing Sheets

GAS DELIVERING APPARATUS FOR CHEMICAL VAPOR DEPOSITION

CROSS-REFERENCE TO RELATED APPLICATION

This application claims the priority benefit of Taiwan application serial no. 87203109, filed Mar. 4, 1998, the full disclosure of which is incorporated herein by reference.

BACKGROUND OF THE INVENTION

1. Field of Invention

The present invention relates to an apparatus used in the fabrication of integrated circuits. More particularly, the present invention relates to a gas delivering apparatus for conducting chemical vapor deposition (CVD).

2. Description of Related Art

Chemical vapor deposition has become one of the most important processes in depositing thin film on semiconductor wafers. Unlike a physical vapor deposition process, which is limited to the deposition of a metallic thin film, all types of thin films required by semiconductor devices, for example, conductive, semi-conductive, or dielectric layers, can be formed by a CVD process. Moreover, the qualities of the deposited layer such as its crystallinity and stoichiometry are better than most other thin film deposition methods.

In general, system for carrying out chemical vapor deposition includes a reactor, a gas supply system, a gas exhaust system and a process control system. For a high-density plasma chemical vapor deposition (HDPCVD) system, the reactor should contain a number of injectors for delivering a gaseous reactant or a mixture of gaseous reactants to the silicon wafer surface. Normally, as soon as a CVD operation starts, the wafer inside the reactor is heated from below and, at the same time, necessary gaseous reactants are delivered to the wafer surface through a system of the injector nozzles. These gaseous reactants are then deposited on the wafer surface, gradually building up a thin layer derived from the reactive materials.

FIG. 1A is a sketch showing a nozzle of a conventional injector. As shown in FIG. 1, the nozzle 10 of a conventional injector is a straight hollow tube. The nozzle 10 serves to deliver a gaseous reactant to the wafer surface for initiating the chemical vapor deposition. However, for this type of design, the maximum spread of the gaseous reactants 12 is quite limited.

FIG. 1B is a sketch showing the distribution of conventional injectors inside a reactor. In a high-density plasma CVD system, the silicon wafer is placed on a wafer stand 14 surrounded by eight injectors 10. As soon as reaction starts, gaseous reactants 12 are injected into the reactor through the nozzles of these eight injectors 10 so that the gaseous reactants 12 can react to form a thin layer on the wafer surface.

FIG. 1C is a top view showing a conventional injector system delivering gaseous reactants to the wafer surface for chemical vapor deposition. As shown in FIG. 1C, a wafer 16 is shown on top of a wafer stand 14, and the gaseous reactants are delivered to the top surface of the wafer 16 through the injector nozzles 10. Because the opening of injector 10 is a straight tube as shown in FIG. 1A, flow rate of the gaseous reactants from the nozzles is quite fast and the spreading range is small. With uneven distribution of gaseous reactants, the rate of distribution in different parts of the wafer surface will be different. Hence, a non-uniform layer will be deposited onto the wafer surface. For example, the deposited thin film in areas 18 and 18' on the wafer 16 is thicker than in other areas.

Since non-uniformity of deposited film can greatly affect the stability of semiconductor devices fabricated on the wafer, this is a highly unsatisfactory gas delivering system.

In light of the foregoing, there is a need to improve the delivery of gaseous reactants.

SUMMARY OF THE INVENTION

Accordingly, the present invention is to improve the delivery of gaseous reactants to a wafer surface by changing the gas flow rate and gas flow pattern so that a uniformly thick film can be deposited over a wafer.

To achieve these and other advantages and in accordance with the purpose of the invention, as embodied and broadly described herein, the invention provides an apparatus for delivering gaseous reactants to a reactor. The apparatus includes flared funnel shaped gas injectors, which are therefore capable of slowing down the gas flow rate and able to spread gasous reactants across a larger wafer area. Hence, a uniformly thick layer is deposited over the wafer through reaction inside the chamber.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
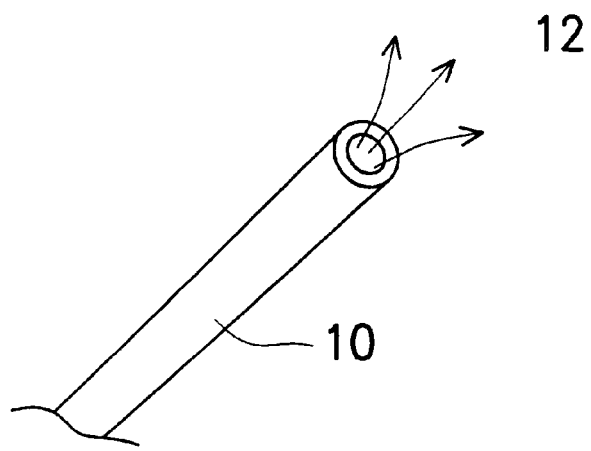
FIG. 1A is a schematically perspective view showing a nozzle of a conventional injector.
Figure 1B:
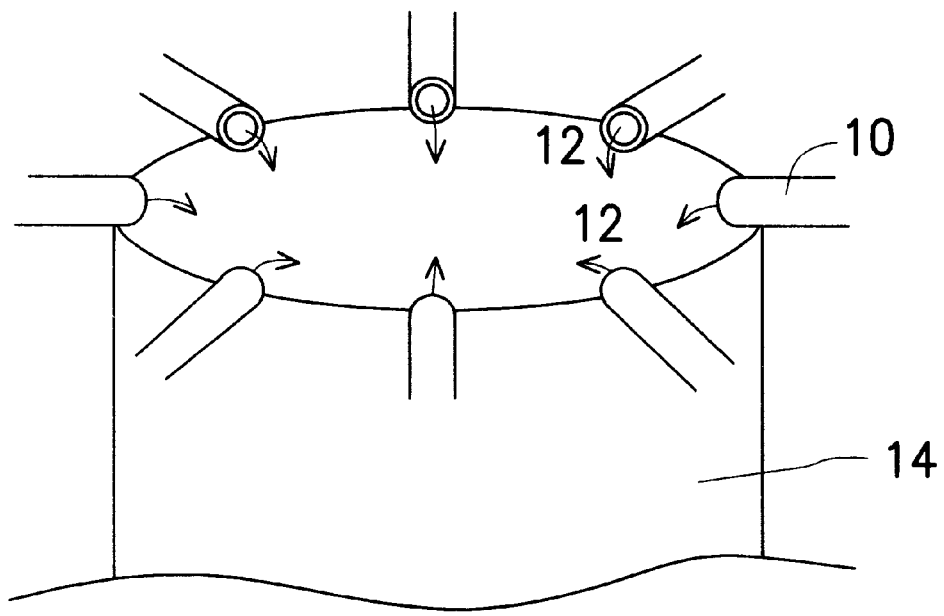
FIG. 1B is a schematically perspective view showing the distribution of conventional injectors inside a reactor.
Figure 1C:
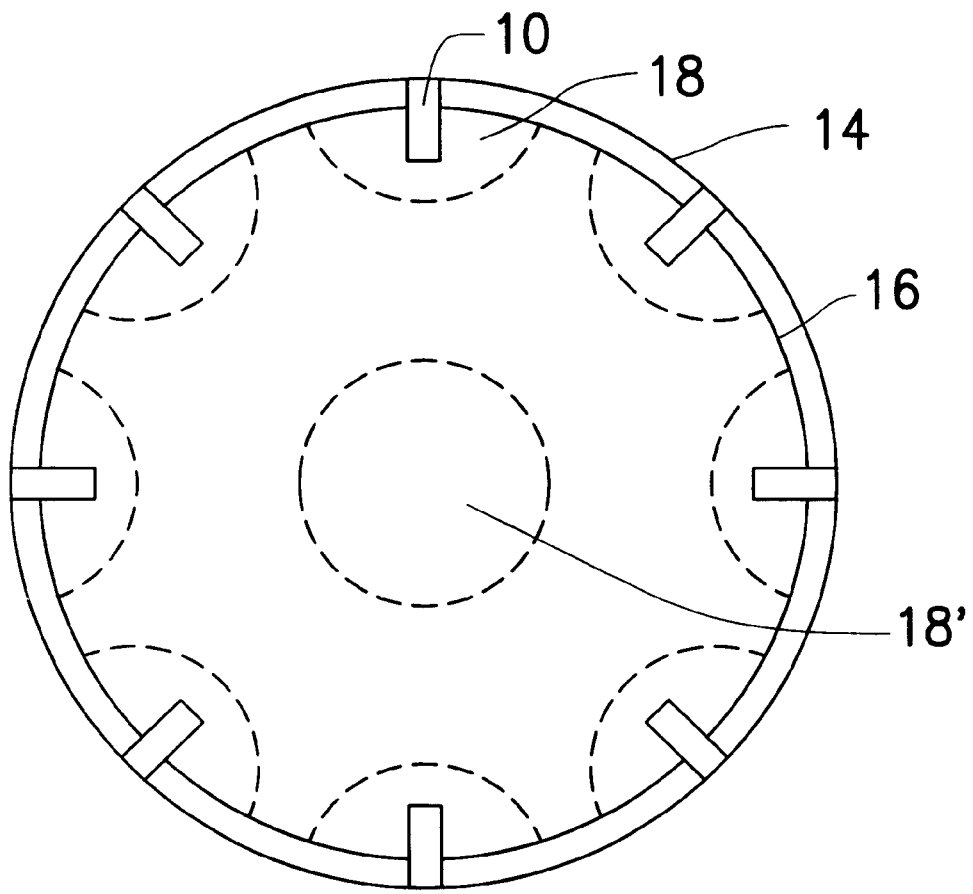
FIG. 1C is a top view showing a conventional injector system delivering gaseous reactants to the wafer surface for chemical vapor deposition.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
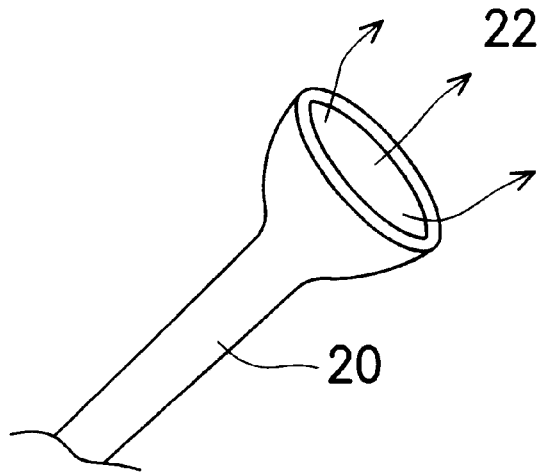
FIG. 2A is a schematically perspective view showing the nozzle of an injector according to one preferred embodiment of this invention.
Figure 2B:
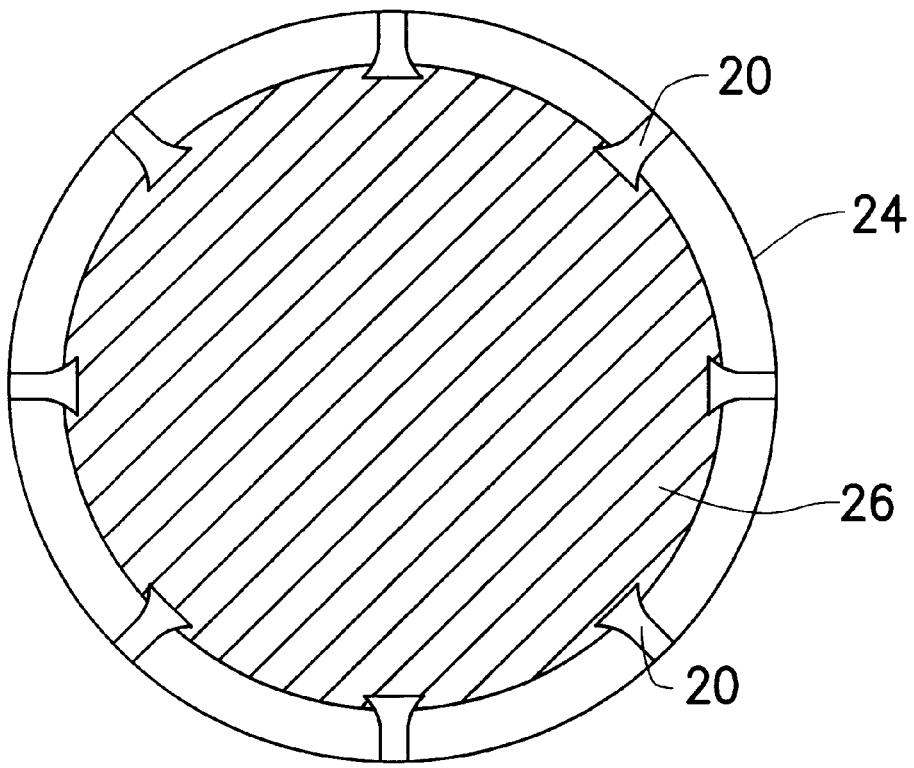
FIG. 2B is a top view showing an injector system delivering gaseous reactants to the wafer surface for chemical vapor deposition according to one preferred embodiment of this invention.

FIG. 2A is a sketch showing the nozzle of an injector according to one preferred embodiment of this invention. FIG. 2B is a top view showing an injector system delivering gaseous reactants to the wafer surface for chemical vapor deposition according to one preferred embodiment of this invention.

As shown in FIGS. 2A and 2B, the straight opening of a conventional injector nozzle is re-shaped into a flared funnel shaped injector 20. In a chemical vapor deposition system such as a high-density plasma chemical vapor deposition (HDPCVD) system or a plasma chemical vapor deposition (plasma CVD) system, the wafer is placed on a wafer stand 24 inside a reactor, wherein the flared funnel-shaped injector is placed in a location above the wafer in the reactor. Gaseous reactants 22 are then delivered to the wafer surface through a multiple of injectors 20. Because the opening of each injector 20 is wider, the flow rate of the gaseous reactants 22 is slower and the spread of the gaseous reactants 22 across the wafer surface is larger and uniform. Hence, thin film 26 having a uniform thickness can easily be obtained.

After chemical reaction has occurred on the wafer surface, the exhaust gases, for example, residual reactants or by-products of the reactants, must be removed from the reactor. The exhaust gases are pumped out through outlets on two sides of each injector so that it is possible to conduct a stable reaction on the wafer surface.

In summary, this invention provides injectors having funnel-shaped openings for delivering gaseous reactants to the wafer surface. The flared funnel-shaped injector is capable of slowing the flow rate of gaseous reactants and provides a better gas flow pattern. Consequently, a uniform film layer is deposited over the wafer and so stable semiconductor devices are manufactured.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A gas supply apparatus suitable for a high-density plasma chemical vapor deposition system, comprising a plurality of flared funnel-shaped injectors for delivering a gaseous reactant or a mixture of gaseous reactants to a surface of a wafer and where a reaction occurs to form a thin film on top of the wafer, wherein the flared funnel-shaped injector is placed in a location above the wafer in the reactor.

2. A gas supply apparatus suitable for a plasma chemical vapor deposition system, comprising a plurality of flared funnel-shaped injectors for delivering a gaseous reactant or a mixture of gaseous reactants to a surface of a wafer where a reaction occurs to form a thin film on top of the wafer, wherein the flared funnel-shaped injector is placed in a location above the wafer in the reactor.

3. A gas supply apparatus for delivering a gaseous reactant or a mixture of gaseous reactants to a reactor, comprising:

- a reactor that allows the gaseous reactant or mixture of gaseous reactants to react and deposit a thin film on a surface of a wafer;
- a plurality of flared funnel-shaped injectors for delivering a gaseous reactant or a mixture of gaseous reactants to the wafer surface where a reaction occurs to form a thin film on top of the wafer, wherein the flared funnel-shaped injector is placed in a location above the wafer in the reactor; and
- a gas exhaust system for pumping the residual gaseous reactant or mixture of gaseous reactants and reaction by-products away so that a stable reacting environment is obtained.

* * * * *